(12) United States Patent
Wu et al.

(10) Patent No.: US 10,080,284 B2
(45) Date of Patent: *Sep. 18, 2018

(54) CIRCUIT BOARD STRUCTURE

(71) Applicant: Unimicron Technology Corp., Taoyuan (TW)

(72) Inventors: Ming-Hao Wu, Taoyuan (TW); Shu-Sheng Chiang, Taipei (TW); Wei-Ming Cheng, Kaohsiung (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/822,222

(22) Filed: Nov. 27, 2017

(65) Prior Publication Data
US 2018/0077799 A1    Mar. 15, 2018

Related U.S. Application Data

(60) Division of application No. 15/287,718, filed on Oct. 6, 2016, now Pat. No. 9,860,984, which is a
(Continued)

(30) Foreign Application Priority Data

Dec. 14, 2015 (TW) .............................. 104141883 A

(51) Int. Cl.
H05K 1/18 (2006.01)
H05K 3/00 (2006.01)
(Continued)

(52) U.S. Cl.
CPC .......... *H05K 1/111* (2013.01); *H05K 1/0296* (2013.01); *H05K 1/0298* (2013.01); *H05K 1/09* (2013.01); *H05K 1/115* (2013.01); *H05K 3/0047* (2013.01); *H05K 3/0073* (2013.01); *H05K 3/4038* (2013.01); *H05K 3/4092* (2013.01); *H05K 3/4644* (2013.01); *H05K 3/4697* (2013.01); *H05K 1/0266* (2013.01); *H05K 2201/094* (2013.01); *H05K 2201/09036* (2013.01);
(Continued)

(58) Field of Classification Search
CPC .. H05K 3/0017; H05K 3/0047; H05K 3/0044; H05K 3/0008; H05K 3/0058; H05K 3/0073; H05K 3/4644
See application file for complete search history.

(56) References Cited

U.S. PATENT DOCUMENTS

2016/0037645 A1* 2/2016 Lee ...................... H05K 3/4697
361/761

* cited by examiner

*Primary Examiner* — Hoa C Nguyen
(74) *Attorney, Agent, or Firm* — JCIPRNET

(57) ABSTRACT

A circuit board structure includes an inner circuit structure and a first build-up circuit structure. The inner circuit structure includes a core layer having an upper surface and a lower surface, a first patterned circuit layer disposed on the upper surface, a second patterned circuit layer disposed on the lower surface and a conductive through hole connecting the first and the second patterned circuit layers. The first build-up circuit structure at least has a cavity and an inner dielectric layer. The inner dielectric layer has an opening communicating the cavity and a pad of the first patterned circuit layer is located in the opening. A hole diameter of the opening is smaller than a hole diameter of cavity. An inner surface of the inner dielectric layer exposed by the cavity and a top surface of the pad are coplanar or have a height difference.

7 Claims, 5 Drawing Sheets

Related U.S. Application Data continuation-in-part of application No. 15/011,649, filed on Jan. 31, 2016, now Pat. No. 9,609,746.

(51) Int. Cl.
*H05K 1/11* (2006.01)
*H05K 3/46* (2006.01)
*H05K 1/02* (2006.01)
*H05K 1/09* (2006.01)
*H05K 3/40* (2006.01)

(52) U.S. Cl.
CPC .............. *H05K 2201/09563* (2013.01); *H05K 2201/09781* (2013.01); *H05K 2203/0376* (2013.01); *H05K 2203/163* (2013.01)

CIRCUIT BOARD STRUCTURE

CROSS-REFERENCE TO RELATED APPLICATION

This application is a divisional application of and claims the priority benefit of U.S. application Ser. No. 15/287,718, filed on Oct. 6, 2016, now allowed. The prior U.S. application Ser. No. 15/287,718 is a continuation-in-part application of and claims the priority benefit of U.S. application Ser. No. 15/011,649, filed on Jan. 31, 2016, now patented, which claims the priority benefit of Taiwan application serial no. 104141883, filed on Dec. 14, 2015. The entirety of each of the above-mentioned patent applications is hereby incorporated by reference herein and made a part of specification.

BACKGROUND OF THE INVENTION

Technical Field

The present invention relates to a circuit board structure, more particularly, relates to a circuit board structure having a cavity.

Background

Generally, in order to manufacture a circuit board structure having a cavity, a copper alignment layer is usually required to be formed on a core layer of an inner circuit structure for the following purpose. When laser ablates the circuit structure to form the cavity in the subsequent process, other than being regarded as a laser blocking layer to prevent the circuit structure from being excessively ablated, the copper alignment layer may also be regarded as a laser alignment pattern that is helpful in performing the laser ablation process. However, because the copper alignment layer is directly formed on the core layer of the inner circuit layer, a circuit layout of the core layer is restricted, and a wiring flexibility of the core layer is thus reduced.

SUMMARY

The present invention provides a circuit board structure, which may have a better layout flexibility.

The invention provides a manufacturing method of a circuit board structure, for manufacturing the above-mentioned circuit board structure.

The circuit board structure of the invention includes an inner circuit structure and a first build-up circuit structure. The inner circuit structure comprises a core layer having an upper surface and a lower surface opposite to each other, a first patterned circuit layer disposed on the upper surface, a second patterned circuit layer disposed on the lower surface and a conductive through hole connecting the first patterned circuit layer and the second patterned circuit layer. The first build-up circuit structure is disposed on the upper surface of the core layer, and covers the first patterned circuit layer, wherein the first build-up circuit structure at least has a cavity and an inner dielectric layer. The cavity exposes a portion of the inner dielectric layer, and the inner dielectric layer directly covers the upper surface of the core layer and the first patterned circuit layer, and the inner dielectric layer has an opening connecting to the cavity. A pad of the first patterned circuit layer is located in the opening, and a hole diameter of the opening is smaller than a hole diameter of cavity, and an inner surface of the inner dielectric layer exposed by the cavity and a top surface of the pad are coplanar or have a height difference.

In one embodiment of the invention, the above-mentioned circuit board structure further includes a metal pillar, a first patterned solder mask layer, a second build-up circuit structure and a second patterned solder mask layer. The metal pillar is disposed inside the opening and directly covering the top surface of the pad, wherein an upper surface of the metal pillar and the inner surface of the inner dielectric layer are coplanar. The first patterned solder mask layer is disposed on a first surface of the first build-up circuit structure relatively far away from the inner circuit structure and on the inner surface of the inner dielectric layer. The second build-up circuit structure is disposed on the lower surface of the core layer, and covers the second patterned circuit layer. The second patterned solder mask layer is disposed on a second surface of the second build-up circuit structure relatively far away from the inner circuit structure.

In one embodiment of the invention, the above-mentioned first build-up circuit structure further includes at least a first dielectric layer, at least a first patterned conductive layer and at least a first conductive through hole structure penetrating through the first dielectric layer and the inner dielectric layer. The first patterned conductive layer and the first dielectric layer are sequentially stacked on the inner dielectric layer, and the first patterned conductive layer is electrically connected to the first patterned circuit layer via the first conductive through hole structure. The second build-up circuit structure includes at least a second dielectric layer, at least a second patterned conductive layer and at least a second conductive through hole structure penetrating through the second dielectric layer. The second dielectric layer and the second patterned conductive layer are sequentially stacked on the lower surface of the core layer, and the second patterned conductive layer is electrically connected to the second patterned circuit layer via the second conductive through hole structure.

In one embodiment of the invention, the above-mentioned circuit board structure further includes a first patterned solder mask layer, a second build-up circuit structure and a second patterned solder mask layer. The first patterned solder mask layer, disposed on a first surface of the first build-up circuit structure relatively far away from the inner circuit structure. The second build-up circuit structure is disposed on the lower surface of the core layer, and covers the second patterned circuit layer. The second patterned solder mask layer is disposed on a second surface of the second build-up circuit structure relatively far away from the inner circuit structure.

In one embodiment of the invention, the above-mentioned first build-up circuit structure further includes at least a first dielectric layer, at least a first patterned conductive layer and at least a first conductive through hole structure penetrating through the first dielectric layer and the inner dielectric layer. The first patterned conductive layer and the first dielectric layer are sequentially stacked on the inner dielectric layer, and the first patterned conductive layer is electrically connected to the first patterned circuit layer via the first conductive through hole structure. The second build-up circuit structure includes at least a second dielectric layer, at least a second patterned conductive layer and at least a second conductive through hole structure penetrating through the second dielectric layer. The second dielectric layer and the second patterned conductive layer are sequentially stacked on the lower surface of the core layer, and the second patterned conductive layer is electrically connected to the second patterned circuit layer via the second conductive through hole structure.

In one embodiment of the invention, the above-mentioned inner dielectric layer extends and covers a portion of the top surface of the pad.

In one embodiment of the invention, the above-mentioned inner surface of the inner dielectric layer includes a first inner surface and a second inner surface, the first inner surface is higher than the second inner surface, and the second inner surface and the top surface of the pad are coplanar.

A manufacturing method of a circuit board structure of the invention includes the following steps. Providing an inner circuit structure. The inner circuit structure comprises a core layer having an upper surface and a lower surface opposite to each other, a first patterned circuit layer disposed on the upper surface, a second patterned circuit layer disposed on the lower surface and a conductive through hole connecting the first patterned circuit layer and the second patterned circuit layer. Forming a metal pillar on a pad of the first patterned circuit layer. Performing a build-up process, to press a first build-up circuit structure on the first patterned circuit layer. The first build-up circuit structure at least includes an inner dielectric layer, and the inner dielectric layer directly covers the upper surface of the core layer and the first patterned circuit layer. Using a contact distance detector to detect an upper surface of the metal pillar relatively far away from the first patterned circuit layer. Using the upper surface of the metal pillar to serve as a depth reference surface, performing a hole drilling process on the first build-up circuit structure, to remove a portion of the first build-up circuit structure and the whole metal pillar, or remove a portion of the first build-up circuit structure and a portion of the metal pillar, so as to form a cavity extending from a first surface of the first build-up circuit structure relatively far away from the inner circuit structure to a portion of the inner dielectric. The cavity exposes an inner surface of the inner dielectric layer, and the inner dielectric layer has an opening connecting to the cavity. The pad is located in the opening, and a hole diameter of the opening is smaller than a hole diameter of the cavity, and an inner surface of the inner dielectric layer exposed by the cavity and a top surface of the pad are coplanar or have a height difference.

In one embodiment of the invention, the above-mentioned contact distance detector is a probe device.

In one embodiment of the invention, edges of the above-mentioned metal pillar and edges of the pad are coplanar.

In one embodiment of the invention, the above-mentioned manufacturing method of the circuit board structure further includes: pressing a second build-up circuit structure on the second patterned circuit layer simultaneously when performing the build-up process; after removing the portion of the first build-up circuit structure and the portion of the metal pillar, the remaining metal pillar is located in the opening, an upper surface of the metal pillar and the inner surface of the inner dielectric layer are coplanar; forming a first patterned solder mask layer on a first surface of the first build-up circuit structure relatively far away from the inner circuit structure and on the inner surface of the inner dielectric layer, wherein the first patterned solder mask layer exposes the upper surface of the metal pillar; and forming a second patterned solder mask layer on a second surface of the second build-up circuit structure relatively far away from the inner circuit structure.

In one embodiment of the invention, after removing the portion of the first build-up circuit structure and at least the portion of the metal pillar, a height of the remaining metal pillar is equal to 5% to 50% of a height of the original metal pillar.

In one embodiment of the invention, the above-mentioned first build-up circuit structure further includes at least a first dielectric layer, at least a first patterned conductive layer and at least a first conductive through hole structure penetrating through the first dielectric layer and the inner dielectric layer. The first patterned conductive layer and the first dielectric layer are sequentially stacked on the inner dielectric layer, and the first patterned conductive layer is electrically connected to the first patterned circuit layer via the first conductive through hole structure. The second build-up circuit structure includes at least a second dielectric layer, at least a second patterned conductive layer and at least a second conductive through hole structure penetrating through the second dielectric layer. The second dielectric layer and the second patterned conductive layer are sequentially stacked on the lower surface of the core layer, and the second patterned conductive layer is electrically connected to the second patterned circuit layer via the second conductive through hole structure.

In one embodiment of the invention, the above-mentioned manufacturing method of the circuit board structure further includes: pressing a second build-up circuit structure on the second patterned circuit layer simultaneously when performing the build-up process; forming a first patterned solder mask layer on a first surface of the first build-up circuit structure relatively far away from the inner circuit structure before performing the hole drilling process on the first build-up circuit structure; and forming a second patterned solder mask layer on a second surface of the second build-up circuit structure relatively far away from the inner circuit structure before performing the hole drilling process on the first build-up circuit structure.

In one embodiment of the invention, the above-mentioned first build-up circuit structure further includes at least a first dielectric layer, at least a first patterned conductive layer and at least a first conductive through hole structure penetrating through the first dielectric layer and the inner dielectric layer. The first patterned conductive layer and the first dielectric layer are sequentially stacked on the inner dielectric layer, and the first patterned conductive layer is electrically connected to the first patterned circuit layer via the first conductive through hole structure. The second build-up circuit structure includes at least a second dielectric layer, at least a second patterned conductive layer and at least a second conductive through hole structure penetrating through the second dielectric layer. The second dielectric layer and the second patterned conductive layer are sequentially stacked on the lower surface of the core layer, and the second patterned conductive layer is electrically connected to the second patterned circuit layer via the second conductive through hole structure.

In one embodiment of the invention, edges of the above-mentioned metal pillar are shrunk from edges of the pad.

In one embodiment of the invention, after removing the portion of the first build-up circuit structure and the whole metal pillar, the inner dielectric layer covers a portion of the top surface of the pad.

In one embodiment of the invention, edges of the above-mentioned metal pillar are protruded from edges of the pad.

In one embodiment of the invention, after removing the portion of the first build-up circuit structure and the whole metal pillar, the inner surface of the inner dielectric layer includes a first inner surface and a second inner surface, the first inner surface is higher than the second inner surface, and the second inner surface and the top surface of the pad are coplanar.

Based on the above, in the manufacturing process of the circuit board structure of the invention, the metal pillar is formed on a portion of the first patterned circuit layer of the inner circuit structure, therefore, the contact distance detector may be used to detect the upper surface of the metal pillar after the build-up circuit structure is completely manufactured, and the upper surface of the metal pillar is used to serve as a depth reference surface, to perform the hole drilling process, so as to form the cavity. As a result, the forming process of the cavity does not affect the circuit layout of the inner circuit structure, therefore, the circuit board structure formed in the invention may provide a larger layout space.

To make the above features and advantages of the invention more comprehensible, embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1A:
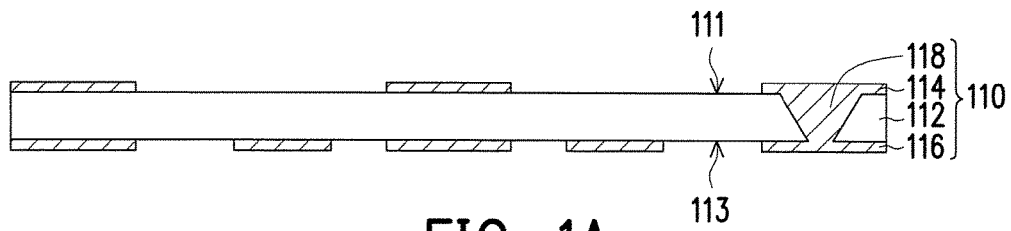
FIG. 1A to FIG. 1F are cross-sectional schematic views depicting a manufacturing method of a circuit board structure of one embodiment of the invention.

FIG. 1A to FIG. 1F are cross-sectional schematic views depicting a manufacturing method of a circuit board structure of one embodiment of the invention. With respect to the manufacturing method of the circuit board structure in the present embodiment, firstly, referring to FIG. 1A, an inner circuit structure 110 is provided, wherein the inner circuit structure 110 includes a core layer 112 having an upper surface 111 and a lower surface 113 opposite to each other, a first patterned circuit layer 114 disposed on the upper surface 111, a second patterned circuit layer 116 disposed on the lower surface 113, and a conductive through hole 118 connecting the first patterned circuit layer 114 and the second patterned circuit layer 116. Herein, materials of the first patterned circuit layer 114 and the second patterned circuit layer 116 are copper, nickel, palladium, beryllium or copper alloy, for example.

Subsequently, referring to FIG. 1B, a metal pillar 120 is formed on a pad P of the first patterned circuit layer 114. Herein, as shown in FIG. 1B, edges of the metal pillar 120 and edges of the pad P are coplanar, and a thickness of the metal pillar 120 is greater than a thickness of the first patterned circuit layer 114, wherein a material of the metal pillar 120 is the same as a material of the first patterned circuit layer 114, such as copper, nickel, palladium, beryllium or copper alloy.

Figure 1B:
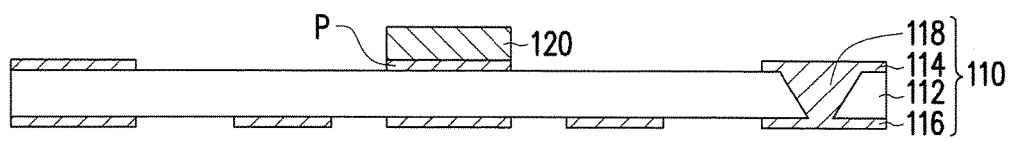
Figure 1C:
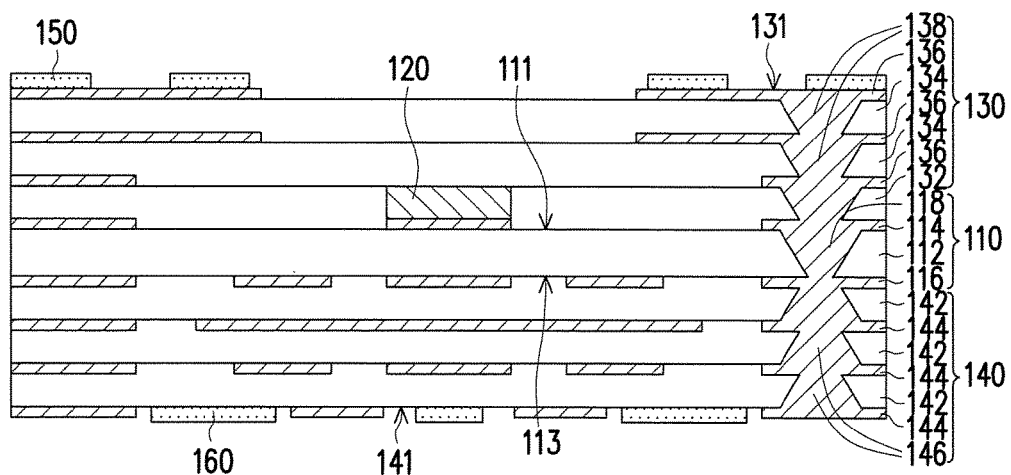

Next, referring to FIG. 1C, a build-up process is performed, to press a first build-up circuit structure 130 and a second build-up circuit structure 140 on the first patterned circuit layer 114 and the second patterned circuit layer 116 respectively. The first build-up circuit structure 130 at least includes an inner dielectric layer 132, and the inner dielectric layer 132 directly covers the upper surface 111 of the core layer 112 and the first patterned circuit layer 114. To be more specific, the first build-up circuit structure 130 of the present embodiment further includes at least a first dielectric layer 134, at least a first patterned conductive layer 136 and at least a first conductive through hole structure 138 penetrating through the first dielectric layer 134 and the inner dielectric layer 132. The first patterned conductive layer 136 and the first dielectric layer 134 are sequentially stacked on the inner dielectric layer 132, and the first patterned conductive layer 136 is electrically connected to the first patterned circuit layer 114 via the first conductive through hole structure 138. The second build-up circuit structure 140 includes at least a second dielectric layer 142, at least a second patterned conductive layer 144 and at least a conductive through hole structure 146 penetrating through the second dielectric layer 142. The second dielectric layer 142 and the second patterned conductive layer 144 are sequentially stacked on the lower surface 113 of the core layer 110, and the second patterned conductive layer 144 is electrically connected to the second patterned circuit layer 116 via the second conductive through hole structure 146.

Subsequently, referring to FIG. 1C, a first patterned solder mask layer 150 is formed on a first surface 131 of the first build-up circuit structure 130 relatively far away from the inner circuit structure 110; and a second patterned solder mask layer 160 is formed on a second surface 141 of the second build-up circuit structure 140 relatively far away from the inner circuit structure 110. Herein, the first patterned solder mask layer 150 exposes a portion of the first dielectric layer 134 that is farthest from the inner circuit structure 110 and a portion of the first patterned conductive layer 136. The second patterned solder mask layer 160 exposes a portion of the second dielectric layer 142 that is farthest from the inner circuit structure 110 and a portion of the second patterned conductive layer 144.

Subsequently, referring to FIG. 1D, a contact distance detector 10 is used to detect an upper surface 121 of the metal pillar 120 relatively far away from the first patterned circuit layer 114. Herein, the contact distance detector 10 is embodied as a probe device. To be more specific, the contact distance detector 10 mainly uses capacitance variation to determine the position being detected. When the contact distance detector 10 perforates the first build-up circuit structure 130 and contacts the upper surface 121 of the metal pillar 120, the capacitance value is varied because of being induced by the conductive material, so as to obtain a depth of the metal pillar 120 that is relative to the first surface 131 of the first build-up circuit structure 130.

Figure 1D:
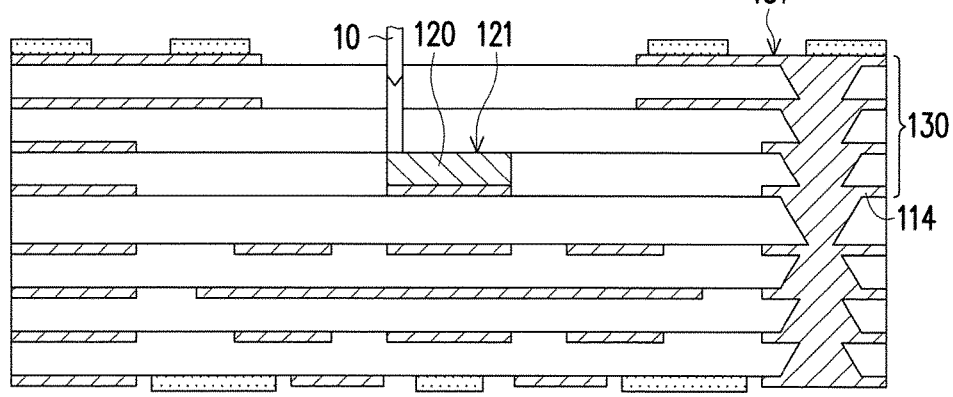
Figure 1E:
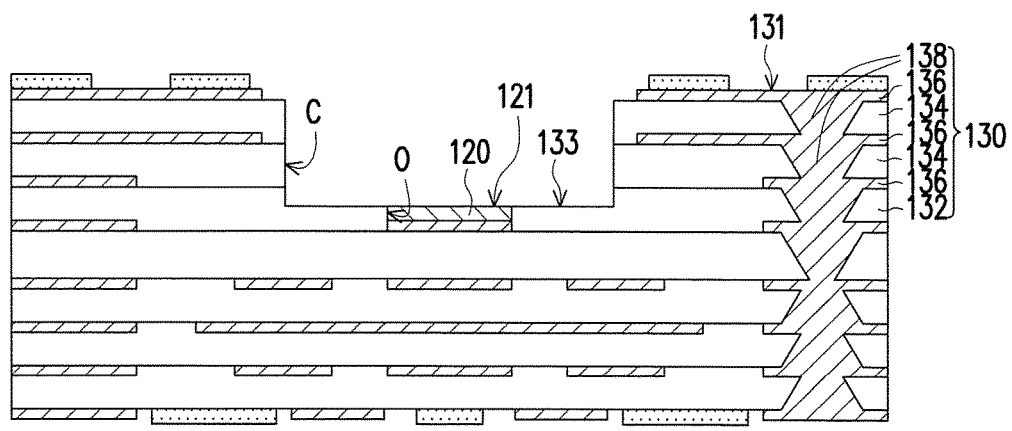

Next, referring to FIG. 1D and FIG. 1E simultaneously, the upper surface 121 of the metal pillar 120 is used to serve as a depth reference surface, a hole drilling process is performed on the first build-up circuit structure 130, to remove a portion of the first build-up circuit structure 130 and a portion of the metal pillar 120, so as to form a cavity C extending from a first surface 131 of the first build-up circuit structure 130 relatively far away from the inner circuit structure 110 to a portion of the inner dielectric layer 132. Herein, the cavity C exposes an inner surface 133 of the inner dielectric layer 132, and the metal pillar 120 is not completely removed, and the upper surface 121 of the remaining metal pillar 120 and the inner surface 133 of the inner dielectric layer 132 are coplanar.

To be more specific, the materials of the first patterned circuit layer 114, the second patterned circuit layer 116 and the metal pillar 120 in the present embodiment all are copper, nickel, palladium, beryllium or copper alloy, when the metal pillar 120 is removed by etching method, the metal pillar 120 may be removed completely or may be partially removed, it is not limited hereto. As shown in FIG. 1E, the remaining metal pillar 120 is located inside an opening O of the inner dielectric layer 132, wherein a hole diameter of the opening O is equal to a diameter of the metal pillar 120. It should be noted in here, after removing a portion of the first build-up circuit structure 130 and a portion of the metal pillar 120, a height of the remaining metal pillar 120 is equal to 5% to 50% of a height of the original metal pillar 120. Preferably, the height of the remaining metal pillar 120 is equal to 10% to 30% of the height of the original metal pillar 120. In other words, the hole drilling process uses the depth reference surface as reference, and further drills a hole in a direction towards the inner circuit structure 110 to form the cavity C. Hence, the bottom surface of the cavity C is substantially lower than or equal to the depth reference surface (the upper surface 121 of the metal pillar 120).

Figure 1F:
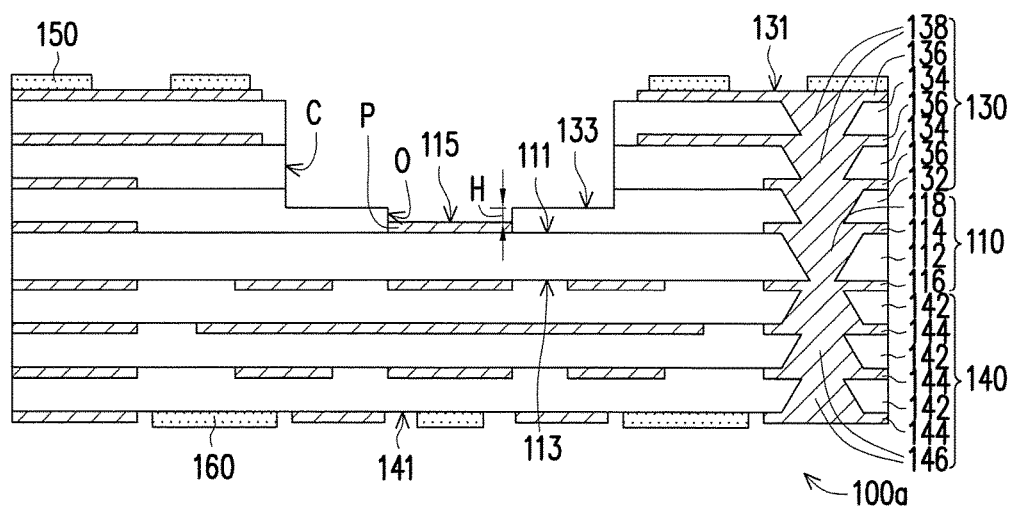

Finally, referring to FIG. 1F, the remaining metal pillar 120 is removed, to expose a top surface 115 of the pad P. Herein, the method for removing the remaining metal pillar 120 is an etching method, for example. As shown in FIG. 1F, the inner dielectric layer 132 has an opening O connecting to the cavity C, and the pad P of the first patterned circuit layer 114 is located inside the opening O, and the hole diameter of the opening O is smaller than the hole diameter of the cavity C. A height difference H is in between an inner surface 133 of the inner dielectric layer 132 exposed by the cavity C and a top surface 115 of the pad P. As a result, the inner dielectric layer 132 may also be regarded as a solder mask layer of the pad P. At this time, the circuit board structure 100a is completely manufactured.

Structurally, referring to FIG. 1F, the circuit board structure 100a of the present embodiment includes the inner circuit structure 110, the first build-up circuit structure 130 and the second build-up circuit structure 140. The inner circuit structure 110 includes the core layer 112 having the upper surface 111 and the lower surface 113 opposite to each other, the first patterned circuit layer 114 disposed on the upper surface 111, the second patterned circuit layer 116 disposed on the lower surface 113 and the conductive through hole 118 connecting the first patterned circuit layer 114 and the second patterned circuit layer 116. The first build-up circuit structure 130 is disposed on the upper surface 111 of the core layer 110, and covers the first patterned circuit layer 114. The first build-up circuit structure 130 at least has the cavity C and the inner dielectric layer 132. The cavity C exposes a portion of the inner dielectric layer 132, and the inner dielectric layer 132 directly covers the upper surface 111 of the core layer 110 and the first patterned circuit layer 114. The inner dielectric layer 132 has an opening O connecting to the cavity C, and the pad P of the first patterned circuit layer 114 is located inside the opening O, and the hole diameter of the opening O is smaller than the hole diameter of the cavity C. The height difference H is in between the inner surface 133 of the inner dielectric layer 132 exposed by the cavity C and the top surface 115 of the pad P. The second build-up circuit structure 140 is disposed on the lower surface 113 of the core layer 110, and covers the second patterned circuit layer 116.

To be more specific, the first build-up circuit structure 130 further includes at least a first dielectric layer 134, at least a first patterned conductive layer 136 and at least a first conductive through hole structure 138 penetrating through the first dielectric layer 134 and the inner dielectric layer 132. The first patterned conductive layer 136 and the first dielectric layer 134 are sequentially stacked on the inner dielectric layer 132, and the first patterned conductive layer 136 is electrically connected to the first patterned circuit layer 114 via the first conductive through hole structure 138. The second build-up circuit structure 140 includes at least a second dielectric layer 142, at least a second patterned conductive layer 144 and at least a conductive through hole structure 146 penetrating through the second dielectric layer 142. The second dielectric layer 142 and the second patterned conductive layer 144 are sequentially stacked on the lower surface 113 of the core layer 110, and the second patterned conductive layer 144 is electrically connected to the second patterned circuit layer 116 via the second conductive through hole structure 146. In addition, the circuit board structure 100a further includes the first patterned solder mask layer 150 and the second patterned solder mask layer 160. The first patterned solder mask layer 150 is disposed on the first surface 131 of the first build-up circuit structure 130 that is relatively far away from the inner circuit structure 110. The second patterned solder mask layer 160 is disposed on the second surface 141 of the second build-up circuit structure 140 that is relatively far away from the inner circuit structure 110.

The height difference H is in between the inner surface 133 of the inner dielectric layer 132 exposed by the cavity C of the circuit board structure 100a of the present embodiment and the top surface 115 of the pad P. Therefore, the inner dielectric layer 132 may be regarded as a solder mask layer of the pad P. In addition, the metal pillar 120 is formed on the pad P of the first patterned circuit layer 114, which is aiming to serve as a detecting target of the contact distance detector 10, so as to serve as a reference for defining the depth and position formed of the cavity C. Furthermore, the metal pillar 120 is completely removed in the subsequent process, therefore, forming the cavity C does not affect the circuit layout of the inner circuit structure 110, thus the circuit board structure 100a formed in the present embodiment may provide a larger layout space.

Figure 2:
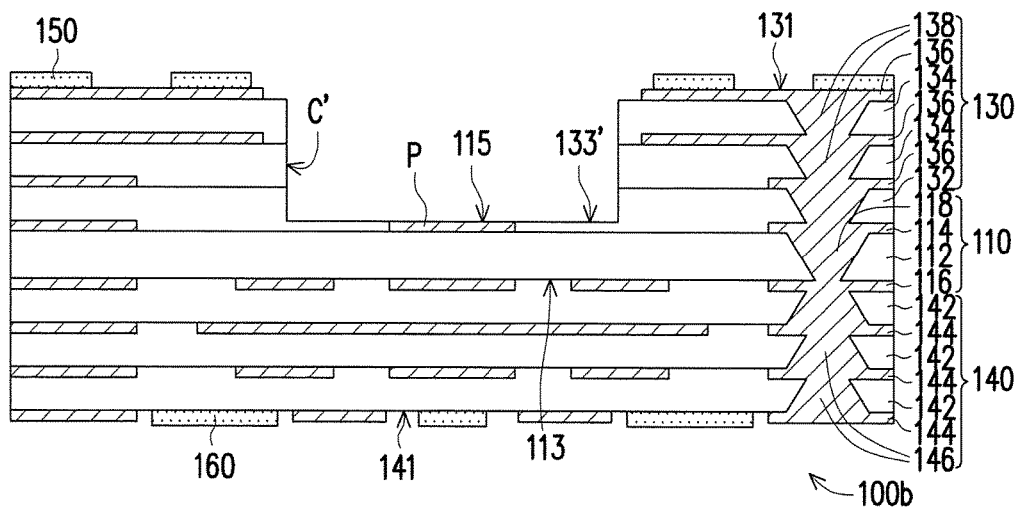
FIG. 2 is a cross-sectional schematic view depicting a circuit board structure of another embodiment of the invention.

As in another embodiment, referring to FIG. 2, the circuit board structure 100b of the present embodiment is similar to the circuit board structure 100a as shown in FIG. 1F, yet the main difference is that: in the step described above as shown in FIG. 1D and FIG. 1E, which is the drilling process performed on the first build-up circuit structure 130 by using the upper surface 121 of the metal pillar 120 as a depth reference surface, a portion of the first build-up circuit structure 130 and the whole metal pillar 120 are removed. Hence, an inner surface 133' of the inner dielectric layer 132 exposed by the cavity C' that is formed and the top surface 115 of the pad P are substantially coplanar.

Figure 3:
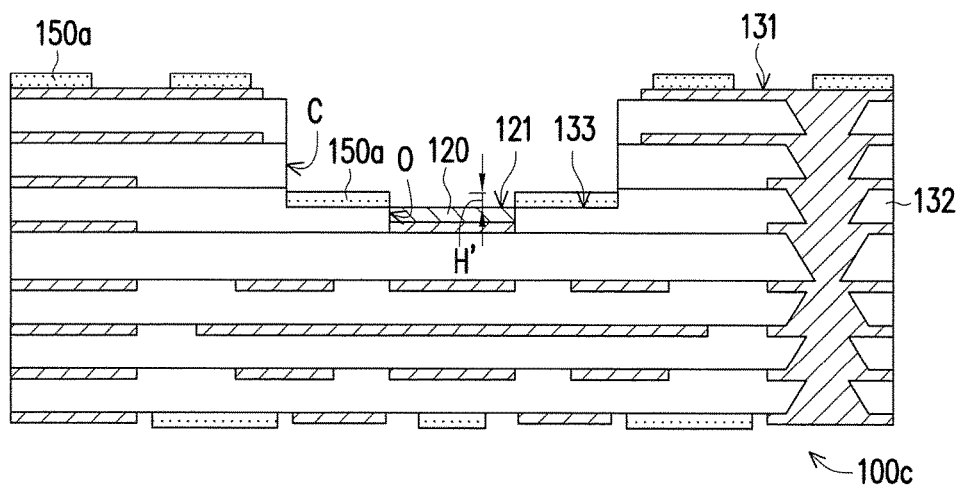
FIG. 3 is a cross-sectional schematic view depicting a circuit board structure of another embodiment of the invention.

FIG. 3 is a cross-sectional schematic view depicting a circuit board structure of another embodiment of the invention. Referring to FIG. 3, the circuit board structure 100c of the present embodiment is similar to the circuit board structure 100a as shown in FIG. 1F, yet the main difference is that: the circuit board structure 100c also includes the metal pillar 120, in other words, after the step in FIG. 1E that the cavity C is formed, the remaining metal pillar 120 is not removed and still located inside the opening O of the inner dielectric layer 132. As shown in FIG. 3, the upper surface 121 of the metal pillar 120 and the inner surface 133 of the inner dielectric layer 132 are coplanar, and the first patterned solder mask layer 150a is disposed on the first surface 131 of the first build-up circuit structure 130 relatively far away from the inner circuit structure 110 and on the inner surface 133 of the inner dielectric layer 132.

In the manufacturing process, the first patterned solder mask layer 150a and the second solder mask layer 160 of the present embodiment are formed after the cavity C is formed, rather than formed before the step in FIG. 1D that the contact distance detector 10 is used to detect the upper surface 121 of the metal pillar 120. Herein, the method of forming the first patterned solder mask layer 150a and the second solder mask layer 160 is, for example, an ink-jet printing method, but it is not limited thereto. The first patterned solder mask layer 150a is formed via the ink-jet printing method, so that the cavity C of the present embodiment has non-single depth, it means that a height difference H' is in between the first patterned solder mask layer 150a exposed by the cavity C and the upper surface 121 of the metal pillar 120.

Figure 4A:
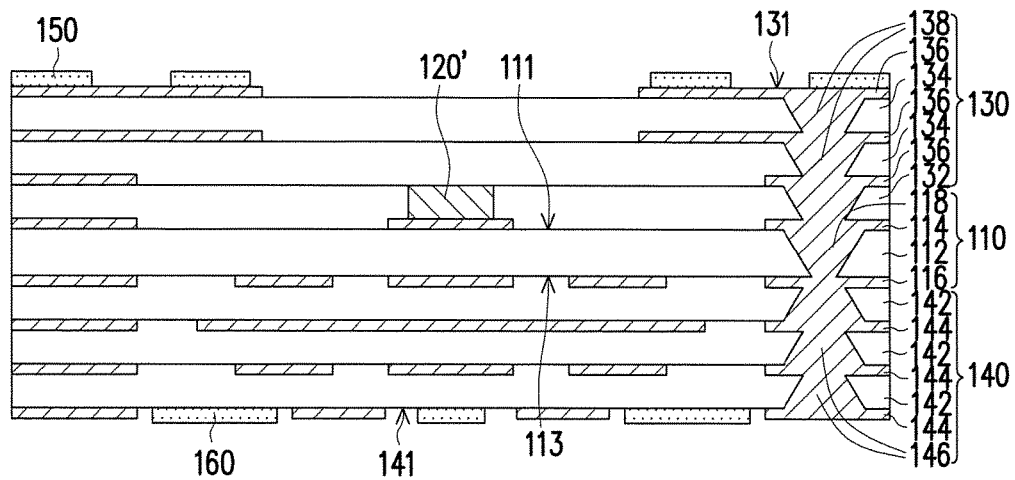
FIG. 4A and FIG. 4B are cross-sectional schematic views depicting partial steps of a manufacturing method of a circuit board structure of another embodiment of the invention.
Figure 4B:
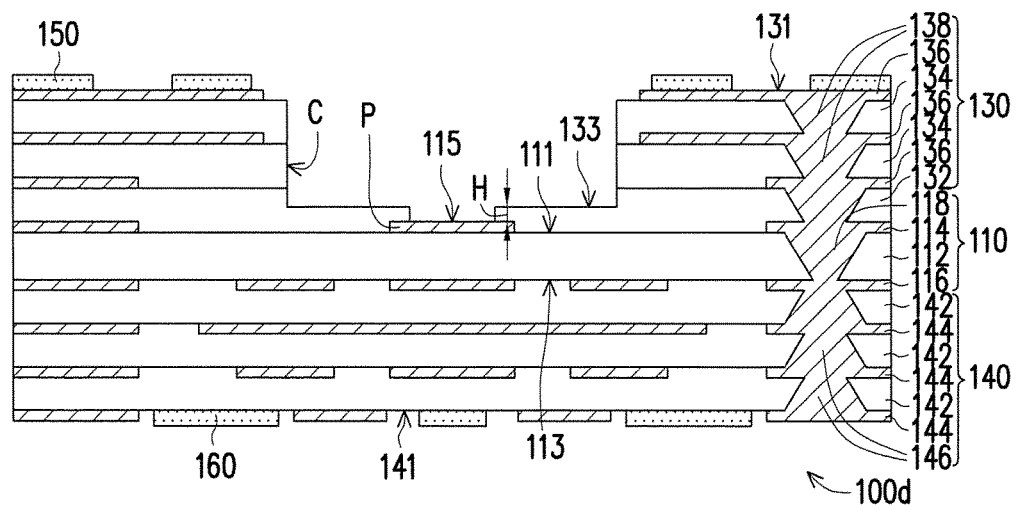

FIG. 4A and FIG. 4B are cross-sectional schematic views depicting partial steps of a manufacturing method of a circuit board structure of another embodiment of the invention. Firstly, referring to FIG. 4B, the circuit board structure 100d of the present embodiment is similar to the circuit board structure 100a as shown in FIG. 1F, yet the main difference is that: the inner dielectric layer 132 of the circuit board structure 100d extends and covers a portion of the top surface 115 of the pad P, and the height difference H is in between the inner surface 133 of the inner dielectric layer 132 exposed by the cavity C and the top surface 115 of the pad P. In this case, the pad P may be regarded as similar to a type of a pad defined by a solder mask.

In the manufacturing process, after the step in FIG. 1A, which is after the inner circuit structure 110 is provided, referring to FIG. 4A, a metal pillar 120' is formed on the pad P of the first patterned circuit layer 114. Herein, referring to FIG. 4A, edges of the metal pillar 120' are shrunk from the edges of the pad P, and a thickness of the metal pillar 120' is greater than the thickness of the first patterned circuit layer 114. Afterward, the circuit board structure 100d in FIG. 4 can be completed by sequentially performing the steps in GIF. 1C to FIG. 1F.

Figure 5A:
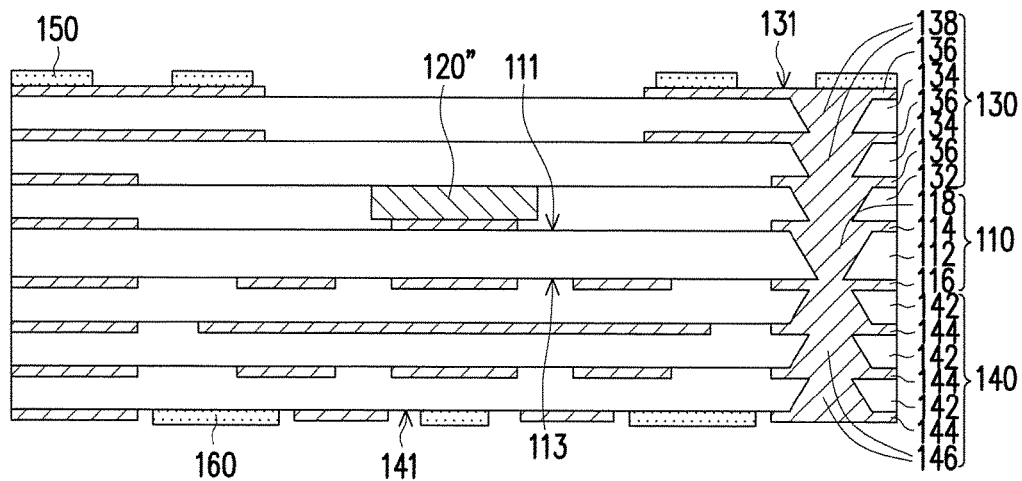
FIG. 5A and FIG. 5B are cross-sectional schematic views depicting partial steps of a manufacturing method of a circuit board structure of another embodiment of the invention.
Figure 5B:
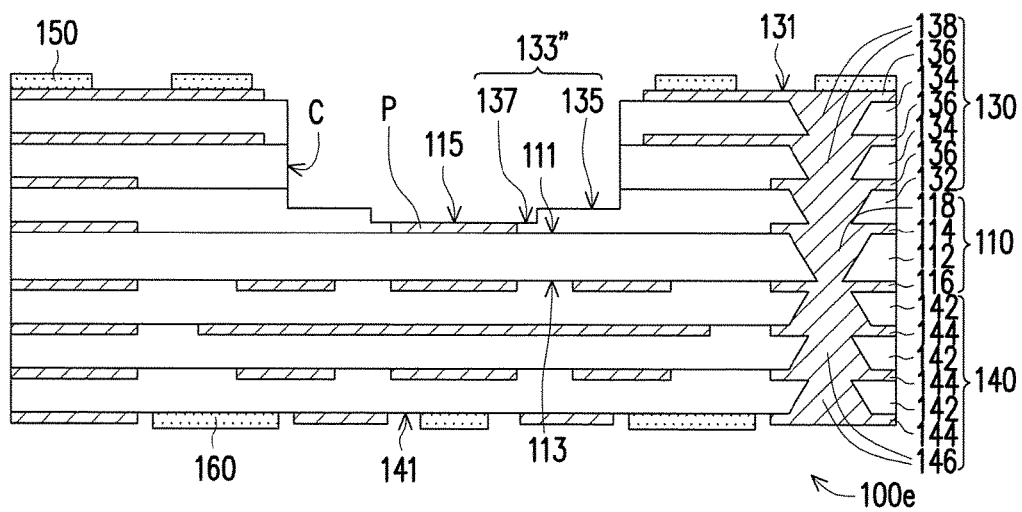

FIG. 5A and FIG. 5B are cross-sectional schematic views depicting partial steps of a manufacturing method of a circuit board structure of another embodiment of the invention. Firstly, referring to FIG. 5B, the circuit board structure 100e of the present embodiment is similar to the circuit board structure 100a as shown in FIG. 1F, yet the main difference is that: an inner surface 133" of the inner dielectric layer 132 of the circuit board structure 100e includes a first inner surface 135 and a second inner surface 137, and the first inner surface 135 is higher than the second inner surface 137, and the second inner surface 137 and the top surface 115 of the pad P are coplanar.

In the manufacturing process, after the step in FIG. 1A, which is after the inner circuit structure 110 is provided, referring to FIG. 5A, a metal pillar 120" is formed on the pad P of the first patterned circuit layer 114. Herein, as shown in FIG. 5A, edges of the metal pillar 120" are protruded from the edges of the pad P, and a thickness of the metal pillar 120" is greater than the thickness of the first patterned circuit layer 114. Afterward, the circuit board structure 100e in FIG. 5B can be completed by sequentially performing the steps in GIF. 1C to FIG. 1F.

In summary, in the manufacturing process of the circuit board structure of the invention, the metal pillar is formed on a portion of the first patterned circuit layer of the inner circuit structure, therefore, the contact distance detector may be used to detect the upper surface of the metal pillar after the build-up circuit structure is completely manufactured, and the upper surface of the metal pillar is used to serve as the depth reference surface, to perform the hole drilling process, so as to form the cavity. As a result, the forming process of the cavity does not affect the circuit layout of the inner circuit structure, therefore, the circuit board structure formed in the invention may provide a larger layout space.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A circuit board structure, comprising:
an inner circuit structure, comprising a core layer having an upper surface and a lower surface opposite to each other, a first patterned circuit layer disposed on the upper surface, a second patterned circuit layer disposed on the lower surface and a conductive through hole connecting the first patterned circuit layer and the second patterned circuit layer; and
a first build-up circuit structure, disposed on the upper surface of the core layer and covering the first patterned circuit layer, wherein the first build-up circuit structure at least has a cavity and an inner dielectric layer, the cavity exposes a portion of the inner dielectric layer, and the inner dielectric layer directly covers the upper surface of the core layer and the first patterned circuit layer, the inner dielectric layer has a first portion with a first thickness and a second portion with a second thickness exposed by the cavity, wherein the second thickness is thinner than the first thickness, and the inner dielectric layer has an opening connecting to the cavity, a pad of the first patterned circuit layer is located in the opening, and a hole diameter of the opening is smaller than a hole diameter of the cavity, and an inner surface of the inner dielectric layer exposed by the cavity and a top surface of the pad are coplanar or have a height difference.

2. The circuit board structure as recited in claim 1, further comprising:
a metal pillar, disposed inside the opening and directly covering the top surface of the pad, wherein an upper surface of the metal pillar and the inner surface of the inner dielectric layer are coplanar;
a first patterned solder mask layer, disposed on a first surface of the first build-up circuit structure relatively far away from the inner circuit structure and on the inner surface of the inner dielectric layer;
a second build-up circuit structure, disposed on the lower surface of the core layer and covering the second patterned circuit layer; and
a second patterned solder mask layer, disposed on a second surface of the second build-up circuit structure relatively far away from the inner circuit structure.

3. The circuit board structure as recited in claim 2, wherein the first build-up circuit structure further comprises at least a first dielectric layer, at least a first patterned conductive layer and at least a first conductive through hole structure penetrating through the first dielectric layer and the inner dielectric layer, the first patterned conductive layer and the first dielectric layer are sequentially stacked on the inner dielectric layer, and the first patterned conductive layer is electrically connected to the first patterned circuit layer via the first conductive through hole structure, and the second build-up circuit structure comprises at least a second dielectric layer, at least a second patterned conductive layer and at least a second conductive through hole structure penetrating through the second dielectric layer, the second dielectric layer and the second patterned conductive layer are sequentially stacked on the lower surface of the core layer, and the second patterned conductive layer is electrically connected to the second patterned circuit layer via the second conductive through hole structure.

4. The circuit board structure as recited in claim 1, further comprising:
   a first patterned solder mask layer, disposed on a first surface of the first build-up circuit structure relatively far away from the inner circuit structure;
   a second build-up circuit structure, disposed on the lower surface of the core layer and covering the second patterned circuit layer; and
   a second patterned solder mask layer, disposed on a second surface of the second build-up circuit structure relatively far away from the inner circuit structure.

5. The circuit board structure as recited in claim 4, wherein the first build-up circuit structure further comprises at least a first dielectric layer, at least a first patterned conductive layer and at least a first conductive through hole structure penetrating through the first dielectric layer and the inner dielectric layer, the first patterned conductive layer and the first dielectric layer are sequentially stacked on the inner dielectric layer, and the first patterned conductive layer is electrically connected to the first patterned circuit layer via the first conductive through hole structure, and the second build-up circuit structure comprises at least a second dielectric layer, at least a second patterned conductive layer and at least a second conductive through hole structure penetrating through the second dielectric layer, the second dielectric layer and the second patterned conductive layer are sequentially stacked on the lower surface of the core layer, and the second patterned conductive layer is electrically connected to the second patterned circuit layer via the second conductive through hole structure.

6. The circuit board structure as recited in claim 1, wherein the inner dielectric layer extends and covers a portion of the top surface of the pad.

7. The circuit board structure as recited in claim 1, wherein the inner surface of the inner dielectric layer comprises a first inner surface and a second inner surface, the first inner surface is higher than the second inner surface, and the second inner surface and the top surface of the pad are coplanar.

* * * * *